(12) United States Patent
Mori et al.

(10) Patent No.: US 6,278,284 B1
(45) Date of Patent: Aug. 21, 2001

(54) TESTING IC SOCKET

(75) Inventors: Yoichi Mori; Yoshihiro Aoki, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/250,260

(22) Filed: Feb. 16, 1999

(30) Foreign Application Priority Data

Feb. 16, 1998 (JP) .................................................. 10-032735

(51) Int. Cl.$^7$ .................................................. G01R 31/00
(52) U.S. Cl. .............................. 324/755; 324/765; 439/69
(58) Field of Search .............................. 324/158.1, 755, 324/756; 349/66, 69

(56) References Cited

U.S. PATENT DOCUMENTS

| 4,700,132 | * | 10/1987 | Yarbrough et al. | 324/158.1 |
| 4,816,426 | * | 3/1989 | Bridges et al. | 439/69 |
| 5,519,331 | * | 5/1996 | Cowart et al. | 324/755 |
| 5,645,433 | * | 7/1997 | Johnson | 439/66 |
| 5,683,256 | * | 11/1997 | Werther | 439/69 |

FOREIGN PATENT DOCUMENTS

| 58-225689 | 12/1983 | (JP) . |
| 63-117923 | 7/1988 | (JP) . |
| 1-288786 | 11/1989 | (JP) . |
| 1-310570 | 12/1989 | (JP) . |
| 2-134833 | 5/1990 | (JP) . |
| 4-553 | 1/1992 | (JP) . |
| 7-58250 | 3/1995 | (JP) . |
| 7-25594 | 5/1995 | (JP) . |

\* cited by examiner

*Primary Examiner*—Safet Metjahic
*Assistant Examiner*—Jimmy Nguyen
(74) *Attorney, Agent, or Firm*—Sughrue, Mion, Zinn, Macpeak & Seas, PLLC

(57) ABSTRACT

An IC socket for testing a grid array package, is configured to be fitted with an adapter socket mounted on a test board. The IC socket includes an IC socket body having a bottom plate formed with a number of contact holding holes penetrating through the bottom plate and arranged in the form of a matrix, and a number of contacts each having a contacting end, a spring portion, a fixing base portion and a contacting pin which are arranged in the named order, the fixing base portion of each of the contacts being inserted into a corresponding contact holding hole of the IC socket body from the upperside of the bottom plate. The IC socket also includes a fixing plate having a corresponding number of fixing apertures and fixed on an upper surface of the bottom plate of the IC socket body by passing the contacts through the fixing apertures, respectively, so that the fixing base portion of the contact is fixed between the bottom plate of the IC socket body and an edge portion of the fixing aperture of the fixing plate.

14 Claims, 8 Drawing Sheets

TESTING IC SOCKET

BACKGROUND OF THE INVENTION

1. Field of the Invention

The present invention relates to an IC socket, and more specifically an IC socket for testing a grid array package.

2. Description of Related Art

In general, an IC socket comprising a resin body and a plurality of metallic contacts each including a connecting terminal for electrically connecting to a corresponding lead or bump of a semiconductor package and a lead formed integrally with the connecting terminal and adapted to be inserted into a corresponding through-hole of a printed circuit board. FIGS. 9A and 9B are diagrammatic sectional views illustrating the structure of conventional IC sockets. As shown in these drawings, an IC socket is assembled by forcibly inserting a contact 1 into a contact fixing hole 3 of an IC socket body 2.

Recently, a variety of semiconductor packages have appeared, and in order to minimize the size of the semiconductor packages, the package is gradually shifting from a quad flat package (QFP) comprising a number of leads 13 outward extending from a periphery of a package body 12 as shown in FIG. 10, to a grid array package such as a ball grid array (BGA) package 14 having a number of solder bumps 15 formed in the form of a matrix on a lower surface of the package to constitute electric contacts of the package, as shown in FIGS. 11A and 11B, a pin grid array (PGA) package, and a land grid array (LGA) package, since these grid array packages can be used at a relatively low cost in place of QFP.

An IC socket used for testing an electric characteristics of the grid array packages such as BGA, PGA and LGA packages, has contacts of a spring structure so that the contacts are brought into pressure-contact with the electric contacts of the package such as leads or solder bumps. Because the contacts of the IC socket are pressure-contacted with the lead or solder bumps of the package, there occurs a phenomenon that a material of the electric contacts of the package is transferred to the contacts of the IC socket, with the result that an electrical contacting condition becomes poor, and therefore, it becomes necessary to frequently exchange the IC socket.

In the prior art, it was a general practice to fix an IC socket 2 to a test board 6, as shown in FIG. 12, by inserting contact pins id extending from the IC socket body 2, into through-holes 6a of the test board 6 from one surface of the test board 6, and then by soldering a tip end portion of the contact pins 1d projected from the other surface of the test board 6, by a solder 19. However, since it is difficult to exchange the IC socket under this practice, it has been proposed to make the IC socket detachable, as shown in FIG. 13, by providing an adapter socket 7 having a corresponding number of pin sockets 8, by soldering the pin sockets 8 to the test board 6 by a solder 19, and on the other hand, by inserting the contact pins 1d of the IC socket body 2 in the pin sockets 8 so that the contact pin 1d is grasped by a contact spring 8a in the inside of the pin socket 8.

However, in the IC socket shown in FIG. 13, if a fixing and grasping force for the contact 1 in the IC socket is inferior to an insertion pressure of the contact pin 1d into the pin socket 8 applied when the IC socket body 2 is fixed to the adapter socket 7, the contact pins are often deviated from each other, and in an extreme case, the contact falls away from the IC socket body. FIG. 14 is a diagrammatic enlarged partial view of the contact 1 and the IC socket body 2. When the contact 1 is inserted in and fixed to the contact fixing hole 3 of the IC socket body 2, the fixing and grasping force $F_0$ acts on the contact 1 from the contact fixing hole 3, and the insertion pressure $F_1$ acts on the contact 1 from a lower position, as shown in FIG. 15. When the relation between these forces becomes $F_0<F_1$, the contact 1 falls out from the IC socket 2, as designated by Reference Numeral 20 in FIG. 16.

In order to prevent the falling-out of the contact, Japanese Patent Application Pre-examination Publication No. JP-A-07-058250 discloses a technology in which, as shown in FIG. 2 of JP-A-07-058250, a barb 10b is formed on each of opposite side surfaces of a contact pin 10, so that when the contact pin 10 is inserted into a through hole of an IC socket body 9, the contact pin 10 is prevented from falling out from the IC socket body 9 by action of a wedge effect of the barb 10b. In this proposal, however, it is impossible to exchange the contact.

There has been also disclosed an IC socket for a plat package such as the QFP having a number of connection leads extending outward from the periphery of the package, the IC socket being configured to firmly hold the contacts by a hold-down plate, as another means for preventing the contact from falling out from the IC socket body.

For example, Japanese Utility Model Application Pre-examination

Publication No. JP-A-07U025594 discloses an IC socket including an upper plate member and a lower plate member and having a structure in which, as shown in FIG. 3 of JP-A-07U025594, a fixing contact 31 in the form of a wedge having a lead 32 to be inserted into a through hole of a printed board 61 is driven into the lower plate member 11, and on the other hand, the upper plate member 21 is provided with a movable contact 35 which can be moved dependently upon the kind of the IC package.

In this IC socket, however, the fixing of the movable contact 35 by the upper plate member 21 is achieved by depressing opposite ends of a stationary contact portion 36 of the movable contact 35 by means of the upper plate member 21. Therefore, the size of the movable contact becomes large, with the result that this IC socket cannot be applied to an IC socket for the grid array package such as BGA package. Japanese Utility Model Application Post-examination Publication No. JP-B-04U000553 discloses an IC socket having, as shown in FIG. 2 of JP-B-04U000553, a number of turned contact pins 5 arranged and aligned on a base plate 1 and a hold-down plate 7 put on a base portion of the turned contact pins 5, the hold-down plate 7 being depressed by a body member 3, so that the contact pins 5 are fixed by the body member 3 through the intermediary of hold-down plate 7. However, this IC socket can be applied for only the flat packet, and cannot be applied to a high density package such as the grid array package having a number of contacts arranged on a bottom surface of the package.

SUMMARY OF THE INVENTION

Accordingly, it is an object of the present invention to provide an IC socket which has overcome the above mentioned problems of the prior art.

Another object of the present invention is to provide an IC socket for testing the grid array package such as BGA package.

The above and other objects of the present invention are achieved in accordance with the present invention by an IC socket for testing a grid array package, the IC socket being configured to be fitted with an adapter socket mounted on a test board, the IC socket including an IC socket body having a bottom plate formed with a number of contact holding holes penetrating through the bottom plate and arranged in the form of a matrix, a number of contacts each having a contacting end, a spring portion, a fixing base portion and a contacting pin which are arranged in the named order, the fixing base portion of each of the contacts being inserted into a corresponding contact holding hole of the IC socket body from the upperside of the bottom plate, and a fixing plate having a corresponding number of fixing apertures and fixed on an upper surface of the bottom plate of the IC socket body by passing the contacts through the fixing apertures, respectively, the fixing base portion of the contact being fixed between the bottom plate of the IC socket body and an edge portion of the fixing aperture of the fixing plate.

In a preferred embodiment of the IC socket, each of the fixing apertures is composed of an insertion section which is larger than a maximum horizontal section of the contact at a level higher than the fixing base portion, for allowing passage of the contacting end and the spring portion of the contact, and a fixing section which is continuous to the insertion section and which is smaller than a horizontal section of the fixing base portion. With this arrangement, the fixing plate is put on the upper surface of the bottom plate of the IC socket body by passing the contacts through the insertion section of the fixing apertures, and then, by shifting the fixing plate in relation to the bottom plate of the IC socket body so that the contacts are moved into the fixing section of the fixing apertures, with the result that the fixing base portion of the contact is fixed between the bottom plate of the IC socket body and an edge portion of the fixing section of the fixing aperture of the fixing plate.

According to another aspect of the present invention, there is provided an IC socket for testing a grid array package, the IC socket being configured to be fitted with an adapter socket mounted on a test board, the IC socket including an IC socket body having a bottom plate formed with a number of contact holding holes penetrating through the bottom plate and arranged in the form of a matrix, a number of contacts having a contacting end, a spring portion, a fixing base portion and a contacting pin which are arranged in the named order, the fixing base portion of each of the contacts being inserted into a corresponding contact holding hole of the IC socket body, and a cured resin coating covering an upper surface of the bottom plate of the IC socket body so that the fixing base portion of the contact is fixed between the bottom plate of the IC socket body and the cured resin coating.

According to still another aspect of the present invention, there is provided an IC socket for testing a grid array package, the IC socket being configured to be fitted with an adapter socket mounted on a test board, the IC socket including an IC socket body having a bottom plate formed with a number of contact holding holes penetrating through the bottom plate and arranged in the form of a matrix, a number of contacts each having a contacting end, a spring portion, a fixing base portion and a contacting pin which are arranged in the named order, the fixing base portion of each of the contacts being inserted into a corresponding contact holding hole of the IC socket body from the underside of the bottom plate, and a fixing plate having a corresponding number of fixing apertures and fixed on a lower surface of the bottom plate of the IC socket body by passing the contacting pin of the contacts through the fixing apertures, respectively, the fixing base portion of the contact being fixed between the bottom plate of the IC socket body and an edge portion of the fixing aperture of the fixing plate.

With the above mentioned arrangement, since the fixing base portion of the contact is accommodated in the contact holding hole formed in the bottom plate of the IC socket body, and fixed between the bottom plate of the IC socket body and the edge portion of the fixing aperture formed in the fixing plate, when the contact is inserted into the pin socket, the contact never falls out from the IC socket body or is never deviated in the axial direction of the contact pin. Therefore, reliability of the IC testing of the grid array package can be elevated.

The above and other objects, features and advantages of the present invention will be apparent from the following description of preferred embodiments of the invention with reference to the accompanying drawings.

BRIEF DESCRIPTION OF THE DRAWINGS

FIG. 11B is a diagrammatic bottom view of the ball grid array (BGA) package shown in FIG. 11a;

DESCRIPTION OF THE PREFERRED EMBODIMENTS

Figure 1:
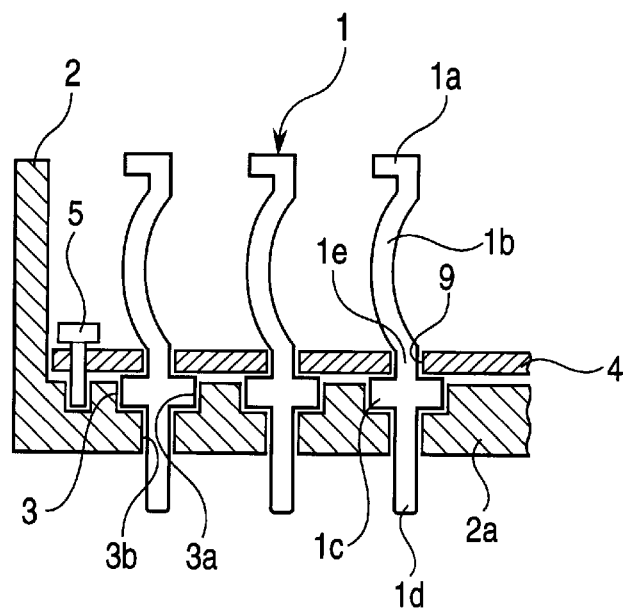
FIG. 1 is a diagrammatic partial sectional view of an essential part of a first embodiment of the IC socket in accordance with the present invention.

Referring to FIG. 1, there is shown a diagrammatic partial sectional view of an essential part of a first embodiment of the IC socket in accordance with the present invention, in a condition that contacts of the IC socket are in a fixed condition.

As shown in FIG. 1, each of the contacts, generally designated with Reference Numeral 1, includes a contacting end 1a, a spring portion 1b, a fixing base portion 1c and a contacting pin 1d, which are arranged in the named order and formed in as a single integral member. In a testing, the contacting end 1a is brought into contact with a corresponding contact of the grid array package, for example, a corresponding bump of the BGA package. In the drawing, the contacting pin 1d extends straight downward from a lower surface of the fixing base portion 1c, and the spring portion 1b extends to depict an arc upward from a top of an upstanding connecting stud 1e formed on an upper surface of the fixing base portion 1c. The contacting end 1a is formed at a tip end of the spring portion 1b. The diameter of the contacting pin 1d is sufficiently smaller than the size of the fixing base portion 1c in a horizontal direction perpendicular to an axial direction of the contacting pin 1d. In the horizontal direction in the drawing, the size of the upstanding connecting stud 1e is sufficiently smaller than the size of the fixing base portion 1c. Furthermore, looking at a plan view, the contacting end 1a and the spring portion 1b are completely included in a contour of the fixing base portion 1c, so that the contacting end 1a and the spring portion 1b can pass through an aperture allowing passage of the fixing base portion 1c.

Each contact 1 is fitted into a contact holding hole 3 formed in a bottom plate 2a of an IC socket body 2, so that a number of contacts 1 are fixed to the IC socket body 2 to be arranged in the form of a matrix having a number of rows and a number of columns. Thus, each contact 1 is fixed at a predetermined position in a horizontal direction and a vertical direction. The contact holding hole 3 has a recess 3a formed on an upper surface of the bottom plate 2a of the IC socket body 2, for accommodating the fixing base portion 1c of the contact 1, and a through hole 3b formed at a center of the recess 3a to penetrate through the bottom plate 2a of an IC socket body, so that the contacting pin 1d of the contact 1 passes through the through hole 3b and a tip end of the contacting pin 1d is projected from a lower surface of the bottom plate 2a of the IC socket body 2.

A fixing plate 4 is mounted on the upper surface of the bottom plate 2a of the IC socket body 2 by means of screws 5 in order to prevent the contact 1 from falling out from the bottom plate 2a of the IC socket body 2 upwardly in the drawing, because of a load or force from the underside of the IC socket in the drawing.

In ordinary cases, the IC socket body 2 is formed of an insulative resin, and the fixing plate 4 is formed of a highly insulative rigid resin such as an epoxy resin and a polyimide resin. However, if a heat resistant property is required, the fixing plate 4 is formed of a ceramic material or a glass-fiber reinforced resin as in a printed circuit board.

Figure 2:
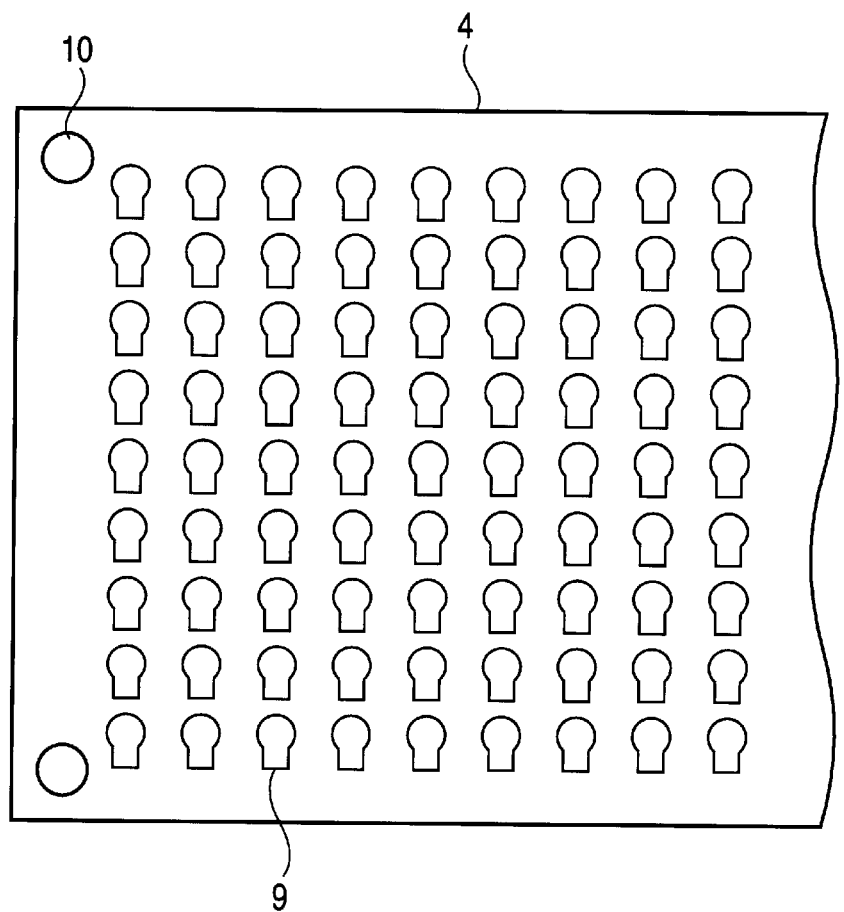
FIG. 2 is a diagrammatic plan view of the fixing plate used in the IC socket shown in FIG. 1.

Referring to FIG. 2, there is shown a diagrammatic plan view of the fixing plate 4. This fixing plate 4 has fixing apertures 9 of the number corresponding to the number of the contacts 1 fixed to the IC socket body 2, in order to fix the fixing base portion 1c of each contact 1 immovably in an axial direction of the contact pin 1d of the contact 1. The fixing plate 4 has screw holes 10 used for fixing the fixing plate 4 to the IC socket body 2 by means of the screws 5.

Figure 3A:
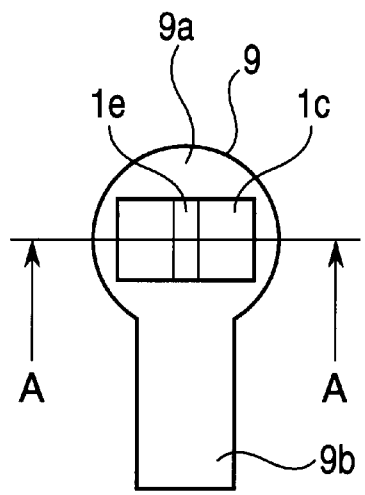
FIG. 3A is a partial plan view illustrating a first positional relation between the fixing base portion of the contact and the fixing aperture of the fixing plate.
Figure 3B:
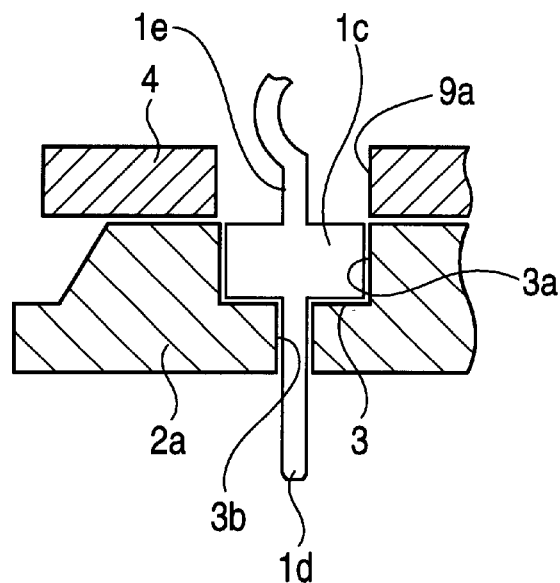
FIG. 3B is a sectional view taken along the line A—A in FIG. 3A.

As shown in FIG. 3A, each of the fixing apertures 9 is formed of a composite aperture composed of a circular aperture 9a having the size larger than the horizontal section of the fixing portion 1c of the contact 1 so as to allow the fixing base portion 1c of the contact 1 and hence the contacting end 1a and the spring portion 1b to pass through the circular aperture 9a, and a rectangular aperture 9b conjoined with the circular aperture 9a and having the size smaller than the horizontal section of the fixing portion 1c of the contact 1 so that the fixing base portion 1c of the contact 1 cannot pass through the rectangular aperture 9b, with the result that the fixing base portion 1c of the contact 1 is held and firmly fixed between the IC socket body 1 and the edge of the rectangular aperture 9b of the fixing plate 4. Therefore, the circular aperture 9a will be called an "insertion section" of the fixing aperture 9 in this specification, and the rectangular aperture 9b will be called a "fixing section" of the fixing aperture 9 in this specification. As an actual matter, the insertion section 9a of the fixing aperture 9 is not necessarily required to be larger than the horizontal section of the fixing portion 1c of the contact 1, if the insertion section 9a of the fixing aperture 9 allows the contacting end 1a and the spring portion 1b to pass through the circular aperture 9a. In other words, it is sufficient if the insertion section 9a of the fixing aperture 9 is larger than a maximum horizontal section of the contact at a level higher than the fixing base portion 1c, for allowing passage of the contacting end 1a and the spring portion 1b of the contact 1.

Figure 4A:
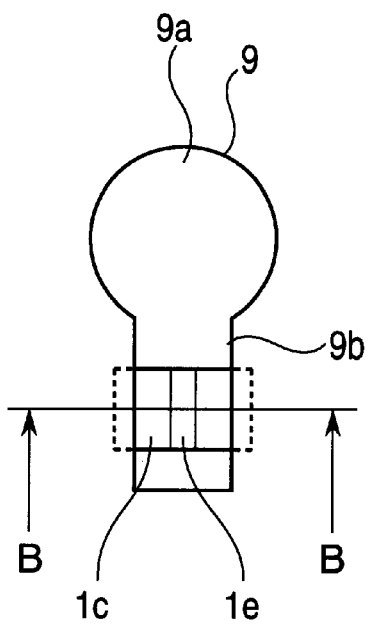
FIG. 4A is a partial plan view illustrating a second positional relation between the fixing base portion of the contact and the fixing aperture of the fixing plate.
Figure 4B:
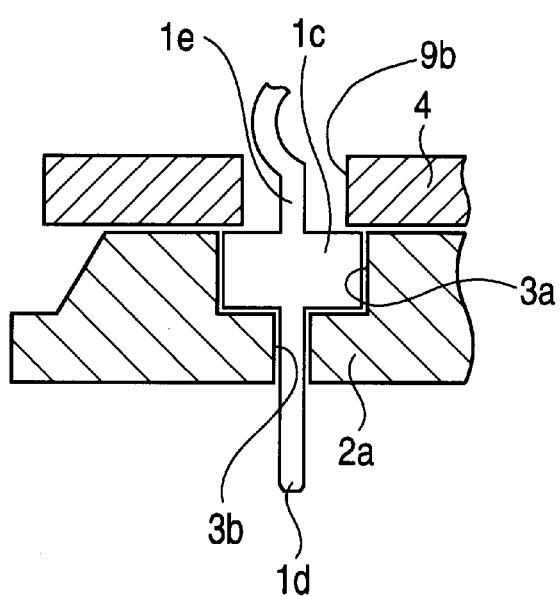
FIG. 4B is a sectional view taken along the line B—B in FIG. 4A.

Now, the manner for fixing the fixing plate 4 to the IC socket body 2 will be described with reference to FIGS. 3A and 3B and FIGS. 4A and 4B. As shown in FIG. 3A which is a partial plan view illustrating a first positional relation between the fixing base portion 1c of the contact 1 and the fixing aperture 9 of the fixing plate 4 and in FIG. 3B which is a sectional view taken along the line A—A in FIG. 3A, after the contact 1 is completely inserted into the IC socket body 2 so that the fixing base portion 1c of the contact 1 is seated on the recess 3a of the contact holding hole 3 and the contacting pin 1d is projected from the lower surface of the bottom plate 2a of the IC socket 2, the fixing plate 4 is put on the upper surface of the bottom plate 2a of the IC socket body 2 by passing the contacting end 1a and the spring portion 1b of the contact 1 through the insertion section 9a of the fixing aperture 9. Thereafter, as shown in FIG. 4A which is a partial plan view illustrating a second positional relation between the fixing base portion 1c of the contact 1 and the fixing aperture 9 of the fixing plate 4, the fixing plate 4 is displaced in relation to the bottom plate 2a of the IC socket body 2 so that the upstanding connecting stud 1e of the contact 1 is shifted into the fixing section 9b of the fixing aperture 9. As a result, as shown in FIG. 4B which is a sectional view taken along the line B—B in FIG. 4A, the fixing base portion 1c of the contact 1 is fixed between the bottom plate 2a of the IC socket 2 and the edge portion of the fixing section 9b of the fixing aperture 9 of the fixing plate 4. Namely, the contact 1 can no longer move in the axial direction of the contacting pin 1d of the contact 1.

Figure 5:
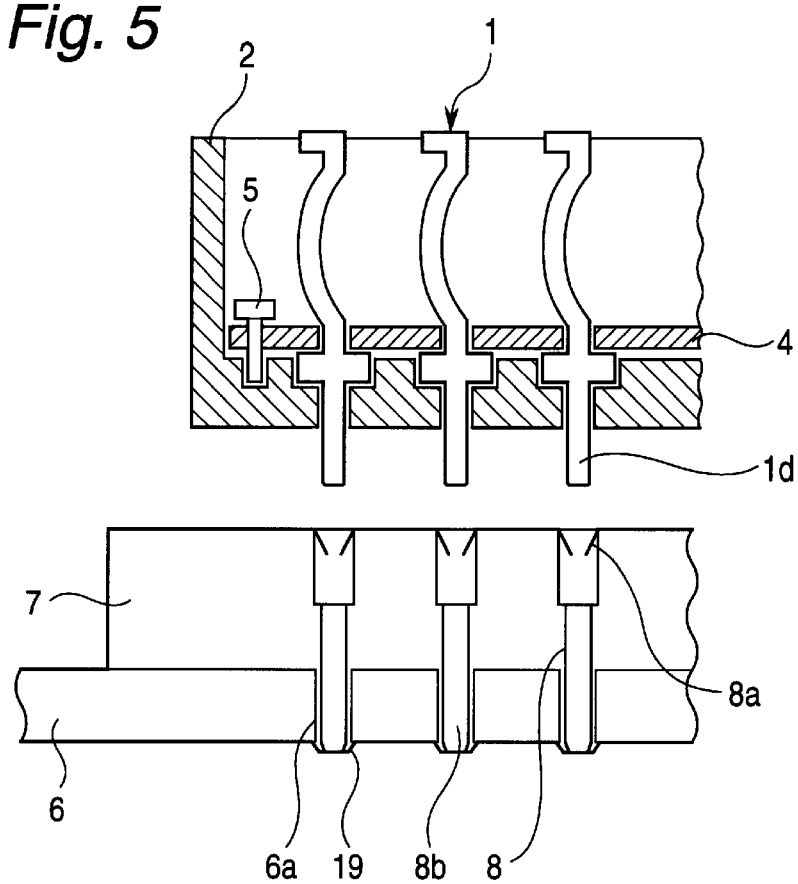
FIG. 5 is a diagrammatic sectional view of a part of a test board and the IC socket for illustrating the manner for assembling the IC socket of the first embodiment of the present invention into the test board.
Figure 6:
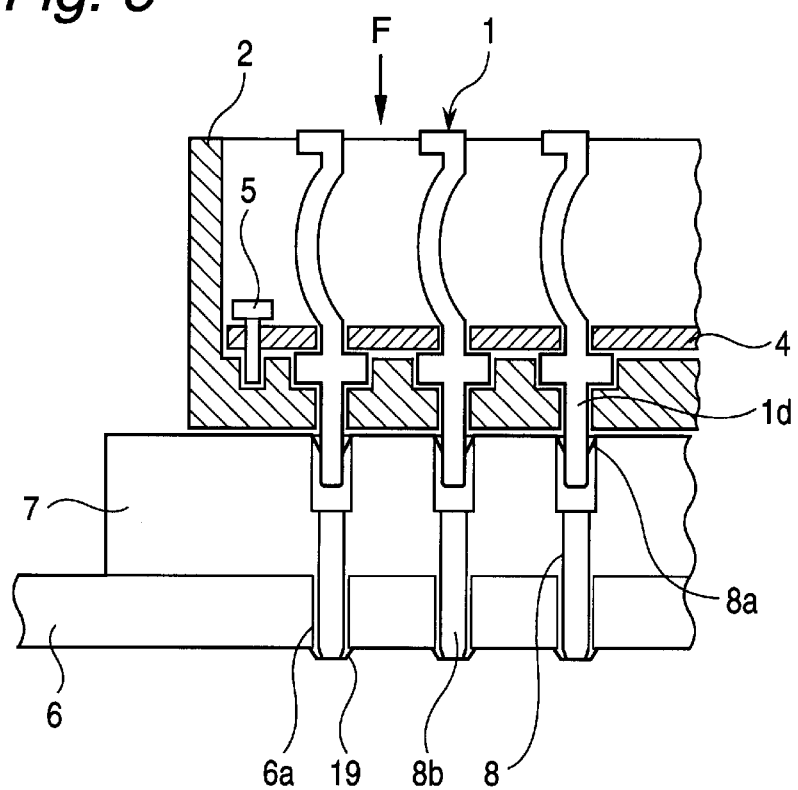
FIG. 6 is a diagrammatic sectional view of a part of the test board and the IC socket when the IC socket of the first embodiment of the present invention is assembled in the test board.

Referring to FIG. 5, there is shown a diagrammatic sectional view of a part of a test board and the IC socket for illustrating the manner for assembling the IC socket of the first embodiment of the present invention into the test board. In FIG. 5, the test board is designated with Reference Numeral 6. A removable adapter socket 7 is fixed to the test board 6, by inserting a lead 8b of each pin socket 8 assembled in the adapter socket 7, into a corresponding through-hole 6a formed to penetrate through the test board 6, and soldering a tip end of the lead 8b of each pin socket 8 projected from the test board 6, by means of a solder 19. The IC socket is assembled with the adapter socket 7 by inserting the contact pin 1d of each contact 1 fixed in the IC socket body 1, into a corresponding pin socket 8 of the adapter socket 7, as shown in FIG. 6 which is a diagrammatic sectional view of a part of the test board and the IC socket when the IC socket of the first embodiment of the present invention is assembled in the test board.

Thus, by inserting the contact pin 1d of the contact 1 into the pin socket 8 with a force F which is larger than a counter force given by a spring action of a spring contact piece 8a formed in the inside of the pin socket 8, the contact pin 1d is brought into an electrical contact with the spring contact piece 8a, and the contact pin 1d of the contact 1 is firmly mechanically held by the spring contact piece 8a by means of the spring action of the spring contact piece 8a. In this case, even if the force given by a spring action of the spring contact piece 8a is large, since the contact 1 is fixed to the IC socket body 2 by the fixing plate 4, the contact is in no way fallen out from the IC socket body 2. On the other hand, if the fixing plate 4 is removed, the contact 1 can be individually freely exchanged.

In the above mentioned embodiment, the insertion section 9a of the fixing aperture 9 is the circular aperture, but the insertion section 9a may be an oval aperture or a rectangular aperture if it allows the passage of the contacting end 1a and the spring portion 1b of the contact 1.

Figure 7:
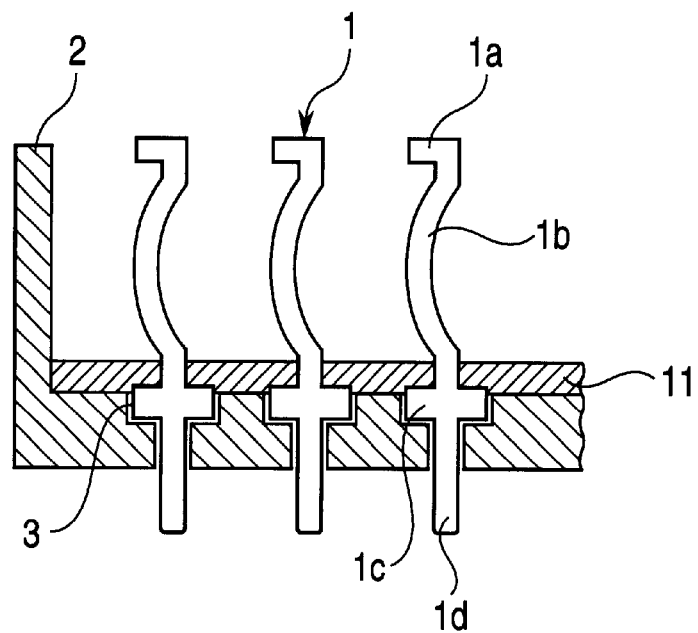
FIG. 7 is a diagrammatic partial sectional view of an essential part of a second embodiment of the IC socket in accordance with the present invention.

Now, a second embodiment of the IC socket in accordance with the present invention will be described with reference to FIG. 7, which is a diagrammatic partial sectional view of an essential part of the second embodiment of the IC socket in accordance with the present invention. In FIG. 7, elements corresponding to those shown in FIG. 1 is given the same Reference Numerals, and explanation will be omitted for simplification of the description.

As seen from comparison between FIG. 1 and FIG. 7, the second embodiment of the IC socket in accordance with the present invention is different from the first embodiment of the IC socket in accordance with the present invention, only in that, in place of the fixing plate 4, a resin coating 11 is formed to cover the upper surface of the bottom plate 2a of the IC socket body 2, in order to prevent each contact from falling out from the bottom plate 2a of the IC socket body 2 upwardly in the drawing.

The resin coating 11 is composed of any material, such as a bonding agent or a time-dependent curing material, having the nature in which the condition of the material can be changed from a liquid phase to a solid phase. Preferably, the resin coating 11 is composed of a thermoset or ultraviolet curing epoxy resin.

Figure 8:
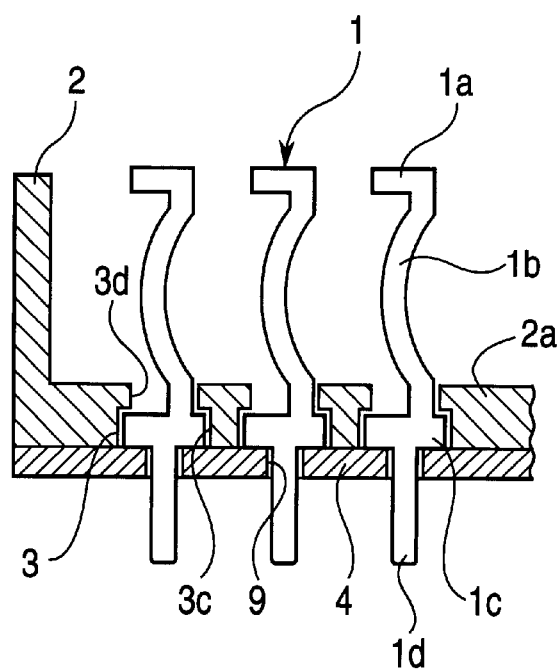
FIG. 8 is a diagrammatic partial sectional view of an essential part of a third embodiment of the IC socket in accordance with the present invention.
Figure 9A:
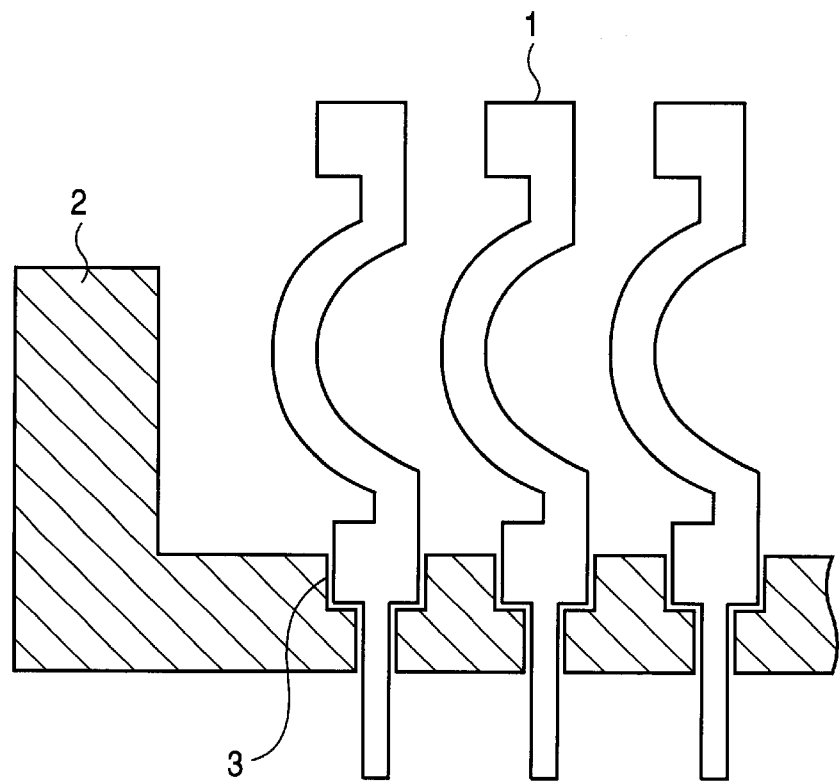
FIGS. 9A and 9B are diagrammatic sectional views illustrating the structure of conventional IC sockets.
Figure 9B:
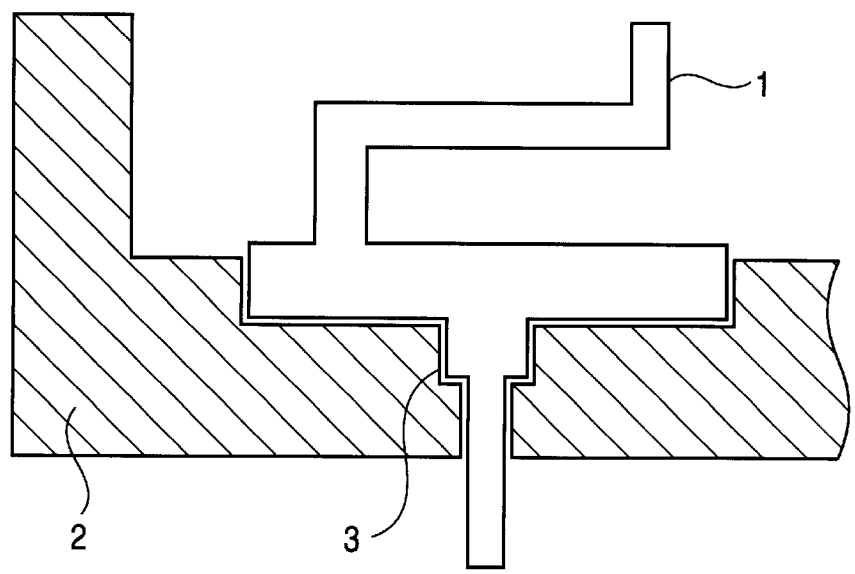
Figure 10:
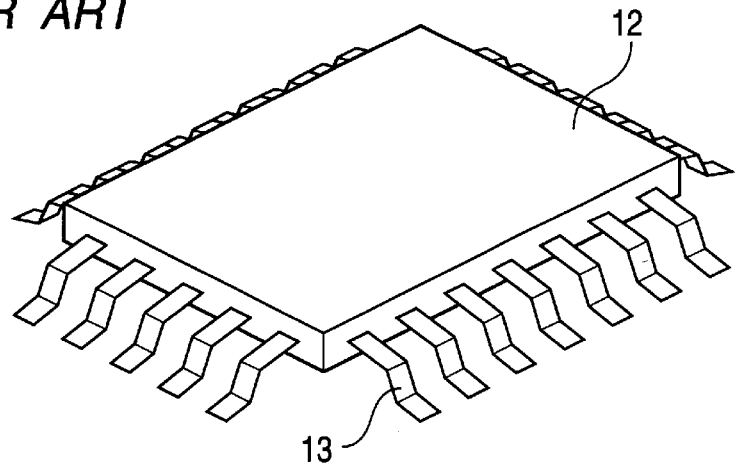
FIG. 10 is a diagrammatic perspective view illustrating one example of the quad flat package (QFP)
Figure 11A:
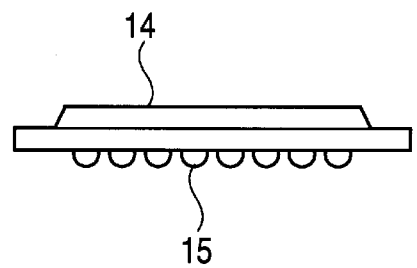
FIG. 11A is a diagrammatic side view illustrating one example of the ball grid array (BGA) package.
Figure 11B:
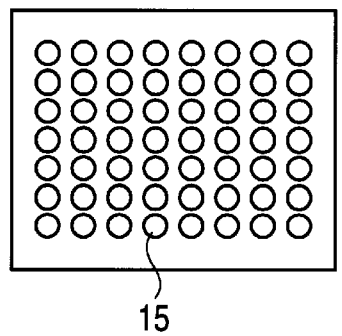
Figure 12:
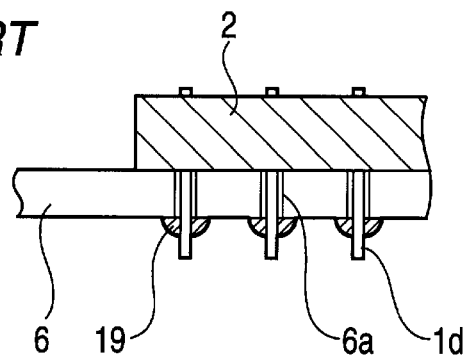
FIG. 12 is a diagrammatic partial sectional view illustrating one example of the prior art general practice for fixing an IC socket to a test board.
Figure 13:
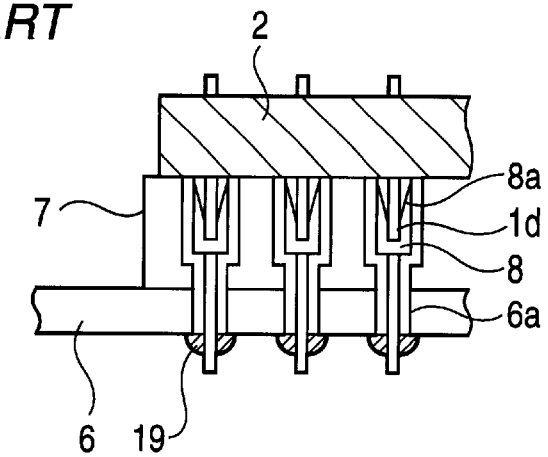
FIG. 13 is a diagrammatic partial sectional view illustrating another example of the prior art practice for fixing an IC socket to a test board by using an adapter socket.
Figure 14:
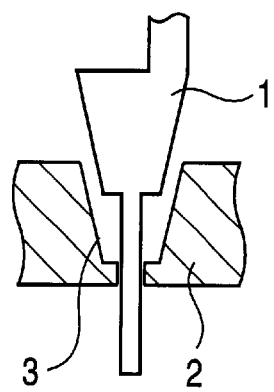
FIG. 14 is a diagrammatic enlarged partial sectional view illustrating the contact and the IC socket body when the contact is partially inserted into the IC socket body.
Figure 15:
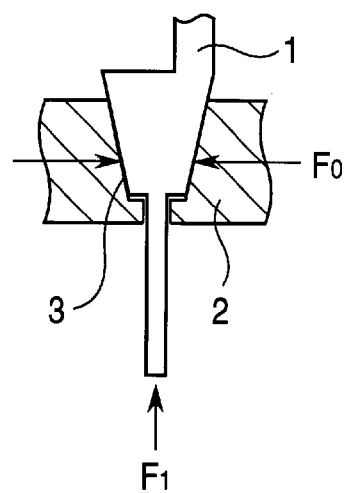
FIG. 15 is a diagrammatic enlarged partial sectional view illustrating the contact and the IC socket body when the contact is completely inserted into the IC socket body.
Figure 16:
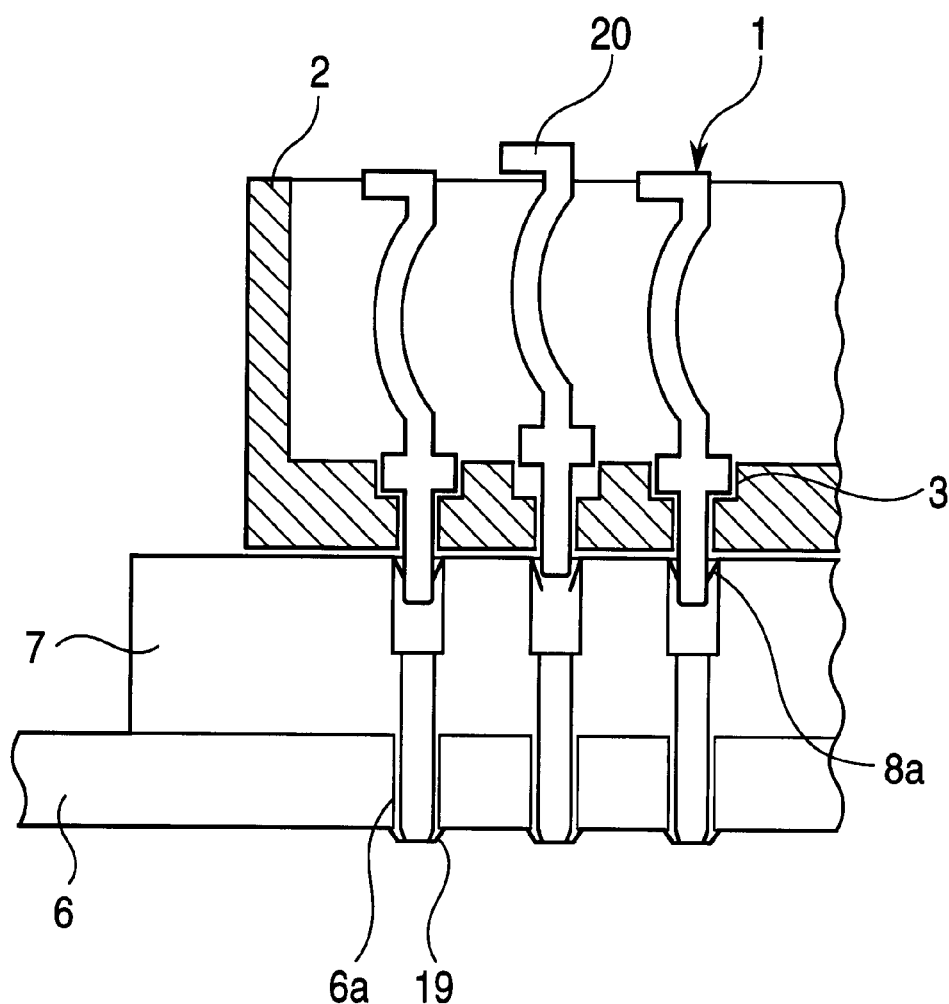
FIG. 16 is a diagrammatic partial sectional view illustrating the condition in which one contact partially falls out from the IC socket so that the contact pin no longer electrically contacts with the pin socket of the adapter socket.

Now, a third embodiment of the IC socket in accordance with the present invention will be described with reference to FIG. 8, which is a diagrammatic partial sectional view of an essential part of the third embodiment of the IC socket in accordance with the present invention. In FIG. 8, elements corresponding to those shown in FIG. 1 is given the same Reference Numerals, and explanation will be omitted for simplification of the description.

In the first and second embodiments, the fixing plate 4 or the resin coating 11 is provided on the upper surface of the bottom plate 2a of the IC socket body 2, namely, in the inside of the IC socket body 2. In this third embodiment, the contact 1 is inserted into the bottom plate 2a of the IC socket body 2, from the underside of the IC socket body 2, and the fixing plate 4 is fixed to the lower surface of the bottom plate 2a.

In brief, the contact holding hole 3 formed in the bottom plate 2a of the IC socket body 2, has a recess 3c formed on the lower surface of the bottom plate 2a of the IC socket body 2, for accommodating the fixing base portion 1c of the contact 1, and a through hole 3d formed at a center of the recess 3c to penetrate through the bottom plate 2a of an IC socket body, so that the contacting end 1a and the spring portion 1b of the contact 1 passes through the through hole 3d but the fixing base portion 1c cannot pass through the through hole 3d. Therefore, the through hole 3d is considerably larger than the through hole 3b in the first and second embodiments, since the through hole 3d must allow the passage of the contacting end 1a and the spring portion 1b. On the other hand, the fixing aperture 9 formed in the fixing plate 4 is of the size allowing passage of only the contacting pin 1d of the contact 1.

With this arrangement, since the contact 1 can be individually inserted into and removed from the bottom plate 2a of the IC socket body 2, at the underside of the socket body 2, it is possible to individually exchange the contact 1.

As seen from the above, in the IC socket in accordance with the present invention, since the fixing base portion of the contact is accommodated in the contact holding hole formed in the bottom plate of the IC socket body, and fixed between the bottom plate of the IC socket body and the edge portion of the fixing aperture formed in the fixing plate, when the contact is inserted into the pin socket, the contact never falls out from the IC socket body or is never deviated in the axial direction of the contact pin. Therefore, reliability of the IC testing of the grid array package can be elevated.

The invention has thus been shown and described with reference to the specific embodiments. However, it should be noted that the present invention is in no way limited to the details of the illustrated structures but changes and modifications may be made within the scope of the appended claims.

What is claimed is:

1. An IC socket fitted with an adapter socket mounted to a test board for testing a grid array package comprising:
    an IC socket body having
        a bottom plate with an upper surface and a lower surface, and
        at least one contact hole that penetrates through the upper surface and the lower surface of the bottom plate, the contact hole having an edge portion;
    at least one contact having
        a contact end,
        a spring portion,
        a fixing base portion inserted into the contact hole from the upper surface of the bottom plate, and
        a contacting pin; and
    a rigid fixing plate having at least one aperture, the contact passing through the aperture when fastening said fixing plate to the upper surface of the bottom plate of said IC socket body, said rigid fixing plate is formed from a material selected from the group consisting of an epoxy resin, a polyimide resin, a ceramic and a glass fiber reinforced resin.

2. An IC socket fitted with an adapter socket mounted to a test board for testing a grid array package according to claim 1, wherein the aperture of said fixing plate comprises:
   an insertion section which allows for the insertion of the contact end of said contact and the spring portion of said contact; and
   a fixing section communicating with said insertion section, said fixing section having a width that is smaller than a width of the fixing base portion of said contact that secures the fixing base portion of said contact between the bottom plate of said IC socket and said rigid fixing plate.

3. An IC socket fitted with an adapter socket mounted to a test board for testing a grid array package according to claim 1, where said rigid fixing plate prevents said contact from moving in the vertical direction.

4. An IC socket fitted with an adapter socket mounted to a test board for testing a grid array package according to claim 1, wherein said IC socket body has a plurality of contact holes arranged in a matrix.

5. An IC socket fitted with an adapter socket mounted to a test board for testing a grid array package according to claim 2, wherein said insertion section is oval.

6. An IC socket fitted with an adapter socket mounted to a test board for testing a grid array package according to claim 2, wherein said insertion section is rectangular.

7. An IC socket fitted with an adapter socket mounted to a test board for testing a grid array package comprising:
   an IC socket body having
      a bottom plate with an upper surface and a lower surface, and
      at least one contact hole that penetrates through the upper surface and the lower surface of the bottom plate, the contact hole having an edge portion;
   at least one contact having
      a contact end,
      a spring portion,
      a fixing base portion inserted into the contact hole from the upper surface of the bottom plate and,
      a contacting pin; and
   a cured coating resin covering the upper surface of the bottom plate of said IC socket body so that the fixing base portion of said contact is secured between the bottom plate of said IC socket and said cured resin coating,
   said cured resin coating is formed of a material selected from the group consisting of a thermoset epoxy resin and an ultraviolet curing epoxy resin.

8. An IC socket fitted with an adapter socket mounted to a test board for testing a grid array package according to claim 7, wherein said IC socket body has a plurality of contact holes arranged in a matrix.

9. An IC socket fitted with an adapter socket mounted to a test board for testing a grid array package comprising:
   an IC socket body having
      a bottom plate with an upper surface and a lower surface, and
      at least one contact hole that penetrates through the upper surface and the lower surface of the bottom plate, the contact hole having an edge portion;
   at least one contact having
      a contact end,
      a spring portion,
      a fixing base portion inserted into the contact hole from the lower surface of the bottom plate, and
      a contacting pin; and
   a rigid fixing plate having at least one aperture, said contact passing through the aperture when fastening said fixing plate to the lower surface of the bottom plate of said IC socket body
   said rigid fixing plate is formed from a material selected from the group consisting of an epoxy resin, a polyimide resin, a ceramic and a glass fiber reinforced resin.

10. An IC socket fitted with an adapter socket mounted to a test board for testing a grid array package according to claim 9, wherein the aperture of said fixing plate comprises:
    an insertion section which allows for the insertion of the contact end of said contact and the spring portion of said contact; and
    a fixing section communicating with said insertion section, said fixing section having a width that is smaller than a width of the fixing base portion of said contact that secures the fixing base portion of said contact between the bottom plate of said IC socket and said rigid fixing plate.

11. An IC socket fitted with an adapter socket mounted to a test board for testing a grid array package according to claim 9, wherein said IC socket body has a plurality of contact holes arranged in a matrix.

12. An IC socket fitted with an adapter socket mounted to a test board for testing a grid array package comprising:
    an IC socket body having
       a bottom plate with an upper surface and a lower surface, and
       at least one contact hole that penetrates through the upper surface and the lower surface of the bottom plate, the contact hole having an edge portion;
    at least one contact having
       a contact end,
       a spring portion,
       a fixing base portion inserted into the contact hole from the upper surface of the bottom plate, and
       a contacting pin; and
    a rigid fixing plate having at least one aperture, the contact passing through the aperture when fastening said fixing plate to the upper surface of the bottom plate of said IC socket body,
    said IC socket body is formed of an insulative resin.

13. An IC socket fitted with an adapter socket mounted to a test board for testing a grid array package according comprising:
    an IC socket body having
       a bottom plate with an upper surface and a lower surface, and
       at least one contact hole that penetrates through the upper surface and the lower surface of the bottom plate, the contact hole having an edge portion;
    at least one contact having
       a contact end,
       a spring portion,
       a fixing base portion inserted into the contact hole from the upper surface of the bottom plate, and
       a contacting pin; and a rigid fixing plate having at least one aperture, the contact passing through the aperture when fastening said fixing plate to the upper surface of the bottom plate of said IC socket body, said rigid fixing plate is formed of a highly insulative resin.

14. An IC socket fitted with an adapter socket mounted to a test board for testing a grid array package comprising:

an IC socket body having
- a bottom plate with an upper surface and a lower surface, and
- at least one contact hole that penetrates through the upper surface and the lower
- surface of the bottom plate, the contact hole having an edge portion;

at least one contact having
- a contact end,
- a spring portion,
- a fixing base portion inserted into the contact hole from the upper surface of the bottom plate, and
- a contacting pin; and a rigid fixing plate having at least one aperture, the contact passing through the aperture when fastening said fixing plate to the upper surface of the bottom plate of said IC socket body, said rigid fixing plate is formed from a heat resistant material.

* * * * *